(12) United States Patent
Chen

(10) Patent No.: US 11,557,699 B2
(45) Date of Patent: Jan. 17, 2023

(54) DISPLAY PANEL, MANUFACTURING METHOD THEREOF, AND ELECTRONIC DEVICE

(71) Applicant: SHENZHEN CHINA STAR OPTOELECTRONICS SEMICONDUCTOR DISPLAY TECHNOLOGY CO., LTD., Guangdong (CN)

(72) Inventor: Lixuan Chen, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 433 days.

(21) Appl. No.: 16/756,186

(22) PCT Filed: Mar. 27, 2020

(86) PCT No.: PCT/CN2020/081706
§ 371 (c)(1),
(2) Date: Apr. 15, 2020

(87) PCT Pub. No.: WO2021/168977
PCT Pub. Date: Sep. 2, 2021

(65) Prior Publication Data
US 2022/0320382 A1    Oct. 6, 2022

(30) Foreign Application Priority Data
Feb. 26, 2020 (CN) .......................... 202010120666.6

(51) Int. Cl.
*H01L 33/50* (2010.01)
*H01L 27/15* (2006.01)
(Continued)

(52) U.S. Cl.
CPC .......... *H01L 33/505* (2013.01); *H01L 27/156* (2013.01); *H01L 33/005* (2013.01); *H01L 33/38* (2013.01)

(58) Field of Classification Search
CPC ................. H01L 27/156; H01L 33/505; H01L 2933/0041
See application file for complete search history.

(56) References Cited

U.S. PATENT DOCUMENTS 10,325,894 B1    6/2019  Pan
2019/0287949 A1*  9/2019 Chong .................... G09G 3/22
2021/0408442 A1* 12/2021 Song .................. H01L 51/5275

FOREIGN PATENT DOCUMENTS

CN    101000922 A    7/2007
CN    101262724 A    9/2008
(Continued)

*Primary Examiner* — Changhyun Yi
(74) *Attorney, Agent, or Firm* — Dickinson Wright PLLC

(57) ABSTRACT

A display panel, a manufacturing method thereof, and an electronic device are provided. The display panel includes a pixel definition layer which has a plurality of opening regions disposed on a driving substrate, and a plurality of light-emitting units including a plurality of pixels disposed in the opening regions, wherein at least two of the pixels in each of the light-emitting units have different heights, a cover plate is disposed opposite to the driving substrate, and a transparent spacer layer is disposed between a body portion and the cover plate.

15 Claims, 3 Drawing Sheets

(51) Int. Cl.
    *H01L 33/00*     (2010.01)
    *H01L 33/38*     (2010.01)

(56) References Cited

FOREIGN PATENT DOCUMENTS

| | | |
|---|---|---|
| CN | 103943662 A | 7/2014 |
| CN | 105633115 A | 6/2016 |
| CN | 106571431 A | 4/2017 |
| CN | 107068707 A | 8/2017 |
| CN | 109004006 A | 12/2018 |
| CN | 109449189 A | 3/2019 |
| CN | 109616500 A | 4/2019 |
| KR | 20190054354 A | 5/2019 |

\* cited by examiner

DISPLAY PANEL, MANUFACTURING METHOD THEREOF, AND ELECTRONIC DEVICE

FIELD OF INVENTION

The present invention relates to the field of display technologies, and in particular, to a display panel, a manufacturing method thereof, and an electronic device.

BACKGROUND OF INVENTION

Current display panels usually include a plurality of light-emitting units, each of which includes red pixel, green pixel, and blue pixel. However, each color pixel includes a first electrode, a light-emitting diode, and a second electrode. As the light-emitting diode of the green pixel is same as the light-emitting diode of the blue pixel, a color conversion layer needs to be fabricated on the green pixel, which leads to a difference in height of the green pixel and the blue pixel, and makes a thickness of the display panels inconsistent, thereby lowering display performance.

Therefore, it is necessary to provide a display panel, a manufacturing method thereof, and an electronic device to solve the problems existing in the conventional art.

SUMMARY OF INVENTION

An object of the present invention is to provide a display panel, a manufacturing method thereof, and an electronic device, which can make a thickness of the display panel more uniform, thereby improving the display performance.

To solve the above technical problems, the present invention provides a display panel, including:

a driving substrate;

a body portion including:

a pixel definition layer disposed on the driving substrate, the pixel definition layer including a plurality of opening regions; and a plurality of light-emitting units, wherein each of the light-emitting units includes a plurality of pixels, the pixels are disposed in the opening regions, and at least two of the pixels in each of the light-emitting units have different heights; and a cover plate disposed opposite to the driving substrate;

wherein a transparent spacer layer is disposed between the body portion and the cover plate, and the transparent spacer layer is configured to maintain a distance between the driving substrate and the cover plate to be consistent.

The present invention also provides an electronic device including the above display panel.

The invention also provides a method of manufacturing a display panel, including:

fabricating a pixel definition layer on the driving substrate and patterning the pixel definition layer to form a plurality of opening regions;

sequentially fabricating a first electrode and a light-emitting diode in the opening regions;

fabricating a second electrode on the light-emitting diode;

fabricating a color conversion layer on a part of the second electrode to obtain a base; and fabricating a transparent spacer layer between the base and a cover plate.

A display panel, a manufacturing method thereof, and an electronic device of the present invention include a driving substrate; a body portion including a pixel definition layer which has a plurality of opening regions disposed on the driving substrate; a plurality of light-emitting units, wherein each of the light-emitting units includes a plurality of pixels, the pixels are disposed in the opening regions, and at least two of the pixels in each of the light-emitting units have different heights; and a cover plate disposed opposite to the driving substrate, wherein a transparent spacer layer is disposed between the body portion and the cover plate, and the transparent spacer layer is configured to maintain a distance between the driving substrate and the cover plate to be consistent. A gap between the driving substrate and the cover plate is maintained due to the addition of the transparent spacer layer, so that a thickness of the display panel is more uniform, and display performance is improved.

DETAILED DESCRIPTION OF EMBODIMENTS

Figure 1:
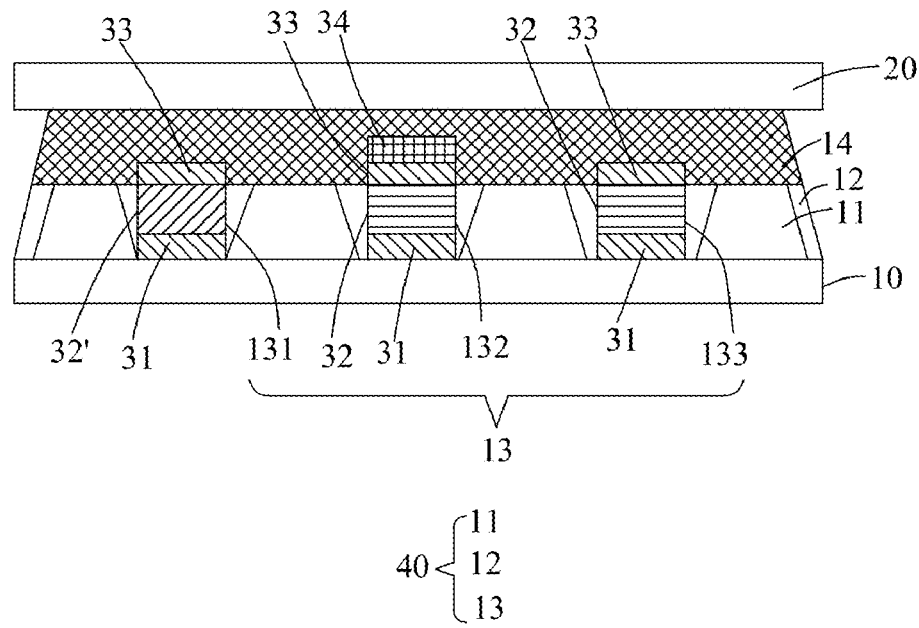
FIG. 1 is a schematic structural diagram of a display panel according to an embodiment of the present invention.

The following description of each embodiment, with reference to the accompanying drawings, is used to exemplify specific embodiments which may be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, components having similar structures are denoted by the same numerals.

The terms "first", "second", and the like in the description and claims of the present application and the above-mentioned drawings are configured to distinguish different objects, rather than describing a specific order. Furthermore, the terms "including" and "having", as well as any modification of them, are intended to cover non-exclusive inclusions.

Please refer to FIG. 1, which is a schematic structural diagram of a display panel according to an embodiment of the present invention.

The display panel 100 of the present embodiment includes a driving substrate 10, a body portion 40, and a cover plate 20.

In an embodiment, the driving substrate 10 includes a base and a switch array layer disposed on the base. The switch array layer includes a plurality of thin film transistors.

The body portion 40 includes a pixel definition layer 11 and a plurality of light-emitting units 13.

The pixel definition layer 11 is disposed on the driving substrate 10. The pixel definition layer 11 includes a plurality of opening regions (not shown in the figure). A reflective layer can also be provided above the pixel definition layer 11 to further improve a light outputting rate.

The light-emitting units 13 include a plurality of pixels 131 to 133, and the pixels are disposed in the opening regions; that is, each pixel corresponds to an opening region. In an embodiment, the light-emitting units 13 include, for example, a red pixel 131, a green pixel 132, and a blue pixel 133. A height of at least two pixels in one of the light-emitting units 13 is different. For example, in an embodiment, a height of the red pixel 131 and a height of the green pixel 132 are different, and the height of the red pixel 131 and a height of the blue pixel 133 are same. Specifically, each of the pixels includes two main pixels 131 and 133, and a sub-pixel 132. A height of the main pixels 131 and 133 is less than a height of the sub-pixel 132. A first difference is defined between the height of the main pixel 131 and the height of the sub-pixel 132. That is, the main pixels include the red pixel and the blue pixel, and the sub-pixel includes the green pixel. Of course, the height of each pixel in each of the light-emitting units is not limited thereto.

Each cross-sectional structure of the main pixels 131 and 133, and a cross-sectional structure of the sub-pixel 132 include a first electrode 31, a light-emitting diode 32 or 32', and a second electrode 33 sequentially disposed on the first electrode 31. The cross-sectional structure of the sub-pixel 132 further includes a color conversion layer 34, and the color conversion layer 34 is disposed on the second electrode 33. The color conversion layer can include a quantum dot film and a functional film of corresponding color.

In an embodiment, the light-emitting diode 32 is a blue light-emitting diode, the light-emitting diode 32' is a red light-emitting diode, and the color conversion layer 34 is a green color conversion layer. Of course, it can be understood that the colors of the main pixels and the sub-pixel are not limited thereto, the colors of the light-emitting diode are not limited thereto, and the colors of the color conversion layer are not limited thereto. For example, in other embodiments, the light-emitting diode 32' is also a blue light-emitting diode. A color conversion layer is provided above the second electrode of the light-emitting diode 32'. The color conversion layer can include a quantum dot film and a functional film of corresponding color. The quantum dot film includes light-emitting quantum dots and a light-scattering agent. The light-scattering agent can increase a propagation path of the excitation light and control a distance between the light-emitting quantum dots. The functional film includes a plurality of film layers arranged in a stack, a refractive index of each film layer can be same or different, and a thickness of each film layer can be same or different, but the refractive indexes of two adjacent film layers are different. The functional film can be made of an inorganic material or an organic material. It can be understood that the light-emitting units 13 can also include other pixels, such as white pixels or yellow pixels, and a number of the light-emitting units 13 is not limited thereto.

In an embodiment, in order to prevent upper and lower electrodes from being short-circuited, the body portion 40 can further include an insulating layer 12 filled in the opening regions, and the insulating layer 12 surrounds a periphery of each of the pixels 13. In order to further improve the light outputting rate, the insulating layer 12 can be doped with nanoparticles. In an embodiment, in order to further improve the light outputting rate, a reflective layer (not shown in the figure) is disposed on an upper surface of the insulating layer 12.

A transparent spacer layer 14 is further disposed on the body portion 40, wherein the transparent spacer layer 14 covers the body portion 40, that is, the pixel definition layer 11, the insulating layer 12, and the light-emitting units 13. That is, the transparent spacer layer 14 is disposed between the body portion 40 and the cover plate 20. The transparent spacer layer 14 is configured to maintain a distance between the driving substrate 10 and the cover plate 20 to be consistent. In other words, it is used to keep an upper surface of the driving substrate 10 flat. The transparent spacer layer 14 in the present embodiment has a full-layer structure. In an embodiment, in order to prevent damage to the light-emitting units, the transparent spacer layer 14 is made of an elastic material, such as one or more of transparent silicone, rubber, latex, and plastic. Material of the transparent spacer layer 14 can include at least one of a siloxane-based material or an acrylic-based material.

The cover plate 20 is disposed opposite to the driving substrate 10. Material of the cover plate 20 can be a plastic with a certain hardness, such as polyethylene terephthalate (PET) or polycarbonate (PC), or glass.

The invention also provides a method of manufacturing a display panel, which specifically includes following steps.

S101, fabricating a pixel definition layer on the driving substrate and patterning the pixel definition layer to form a plurality of opening regions.

Figure 4:
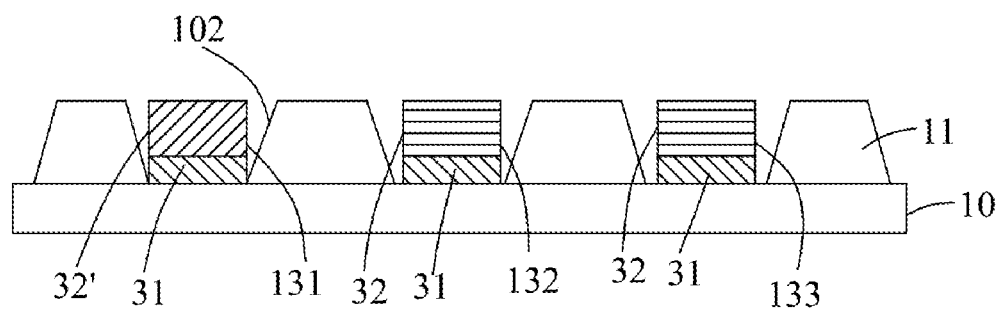
FIG. 4 is a schematic structural diagram showing a first step and a second step of a method of manufacturing a display panel according to an embodiment of the present invention.

For example, as shown in FIG. 4, the pixel definition layer 11 is fabricated on the driving substrate 10, and the pixel definition layer 11 is patterned to form the opening regions 102.

S102, sequentially fabricating a first electrode and a light-emitting diode in the opening regions.

For example, as shown in FIG. 4, the first electrode 31 and the light-emitting diode 32 or 32' are sequentially fabricated in the opening regions 102.

S103, fabricating a second electrode on the light-emitting diode.

Figure 6:
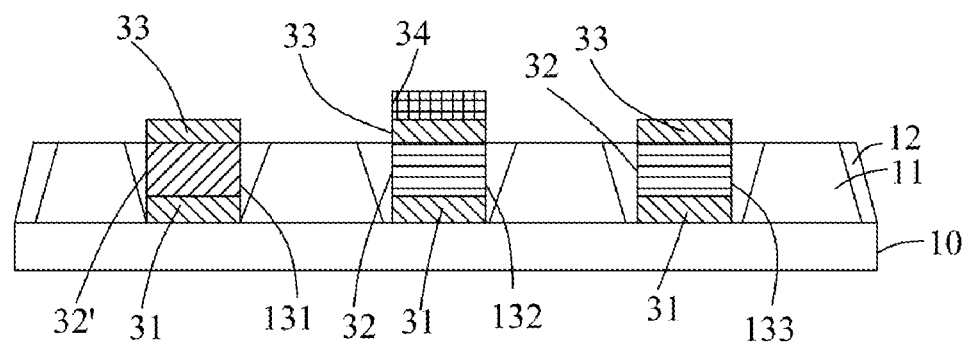
FIG. 6 is a schematic structural diagram of a fourth step and a fifth step of the method of manufacturing the display panel according to the embodiment of the present invention.

For example, as shown in FIG. 6, the second electrode 33 is fabricated on the light-emitting diode 32 or 32'.

S104, fabricating a color conversion layer on a part of the second electrode to obtain a base.

For example, as shown in FIG. 6, in an embodiment, the color conversion layer 34 is formed on the light-emitting diode 32 corresponding to the green pixel 132, in the meantime, the color conversion layer need not be formed on the light-emitting diode 32 corresponding to the blue pixel 133, and the color conversion layer need not be formed on the light-emitting diode 32' corresponding to the red pixel 131, so as to form the base 50. Of course, the color conversion layer is not limited to being fabricated on the light-emitting diode 32 corresponding to the green pixel.

S105, fabricating a transparent spacer layer on the color conversion layer, the second electrode, an insulating layer, and the pixel definition layer.

Referring to FIG. 1, the transparent spacer layer 14 is fabricated on the color conversion layer 34, the second electrode 33, the insulating layer 12, and the pixel definition layer 11. That is, the transparent spacer layer 14 is formed on the base 50 at this time, wherein the base 50 includes the driving substrate 10 and the body portion 40. The specific structure and material of the transparent spacer layer 14 are described as above-mentioned.

S106, fabricating a cover plate on the transparent spacer layer.

Referring to FIG. 1, in an embodiment, the cover plate 20 is attached to the transparent spacer layer 14.

In another embodiment, in order to prevent a short circuit between the first electrode and the second electrode, the above method can further include:

S107, forming the insulating layer in the opening regions of a periphery of the first electrode and the light-emitting diode.

Figure 5:
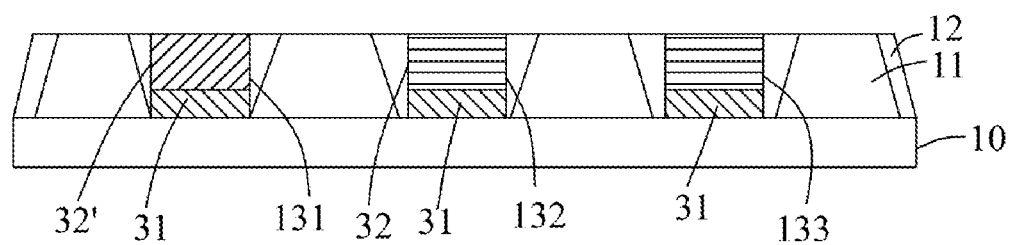
FIG. 5 is a schematic structural diagram showing a third step of the method of manufacturing the display panel according to the embodiment of the present invention.

For example, as shown in FIG. 5, the insulating material is deposited in the opening regions 102 not covered by the first electrode 31 and the light-emitting diode 32 or 32', and also deposited on the light-emitting diode 32 or 32' and the pixel definition layer 11 to form the insulating layer. Then, the insulating layer on the light-emitting diode 32 or 32' and the pixel definition layer 11 is removed, so that the insulating layer 12 is defined only on the periphery of the first electrode 31 and the light-emitting diode 32 or 32'.

Figure 2:
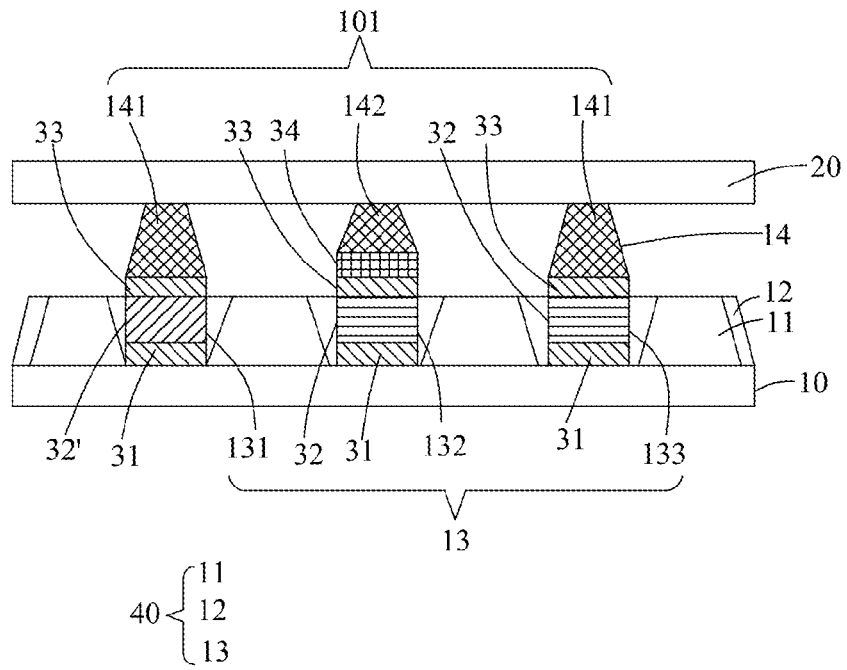
FIG. 2 is a schematic structural diagram of a display panel according to another embodiment of the present invention.

Please refer to FIG. 2, which is a schematic structural diagram of a display panel according to another embodiment of the present invention.

The difference between the display panel of the present embodiment and the previous embodiment is that the transparent spacer layer 14 of the present embodiment has a patterned structure, that is, the transparent spacer layer 14 is disposed on the light-emitting units 13.

The transparent spacer layer 14 of the present embodiment includes a plurality of spacers 101, and the spacers 101 disposed corresponding to positions of the light-emitting units 13. In an embodiment, the spacers 101 includes a plurality of main spacer 141 and a plurality of sub-spacers 142, and each of the main spacers 141 corresponds to a position of the main pixel 131 or 133, and each of the sub-spacers 142 corresponds to a position of the sub-pixel 132; wherein a height of the main spacers 141 is greater than a height of the sub-spacers 142.

In order to further improve the uniformity of the display panel, a second difference is defined between the height of the main spacers 141 and the height of the sub-spacers 142, and the second difference is equal to the first difference.

Since the transparent spacer layer is fabricated on the body portion, the upper surface of the driving substrate is made flatter, and the gap between the driving substrate and the cover plate is kept consistent; therefore, the thickness of the display panel is more uniform, and the display performance is improved.

The manufacturing method of the display panel of the present embodiment is different from the previous embodiment in that the method between the steps S105 and S106 further includes:

S201, patterning the transparent spacer layer 14 to form the spacers 101.

Figure 3:
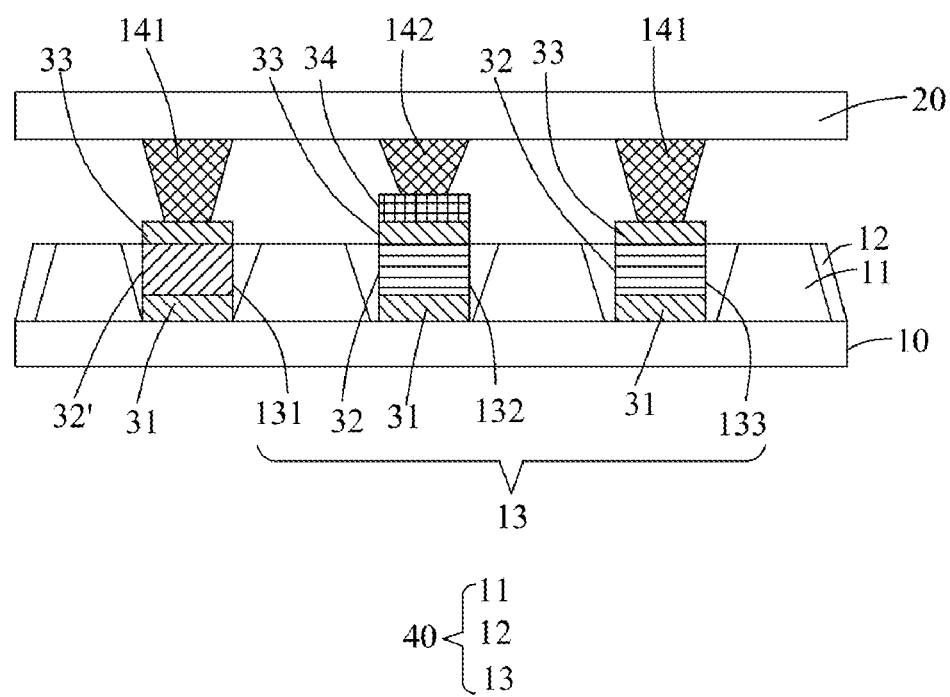
FIG. 3 is a schematic structural diagram of a display panel according to yet another embodiment of the present invention.

Please refer to FIG. 3, which is a schematic structural diagram of a display panel according to another embodiment of the present invention.

The display panel of the present embodiment is different from the previous embodiment in that the transparent spacer layer 14 of the present embodiment is disposed on a side of the cover plate 20 close to the body portion 40. In an embodiment, the transparent spacer layer 14 is disposed below the cover plate 20.

The present invention also provides a method of manufacturing a display panel. The method of manufacturing the display panel in the present embodiment is different from the previous embodiment in that the method in the fifth step and the sixth step are different. The fifth and sixth steps of the present embodiment are as follows.

S105', forming a transparent spacer layer on a side of the cover plate close to the body portion.

In an embodiment, referring to FIG. 3, the transparent spacer layer 14 is formed under the cover plate 20, and the transparent spacer layer 14 is patterned to form the spacers 101. The specific structure and material of the transparent spacer layer 14 are described as above-mentioned.

S106', attaching the cover plate to the base.

With reference to FIG. 3 and FIG. 6, in an embodiment, the cover plate 20 and the above-mentioned base 50 are bonded together.

Since the transparent spacer layer is fabricated on the body portion, the upper surface of the driving substrate is made flatter, and the gap between the driving substrate and the cover plate is kept consistent; therefore, the thickness of the display panel is more uniform, and the display performance is improved.

The present invention further provides an electronic device including any one of the display panels 100 described above.

A display panel, a manufacturing method thereof, and an electronic device of the present invention include a driving substrate; a body portion including a pixel definition layer which has a plurality of opening regions disposed on the driving substrate; a plurality of light-emitting units, wherein each of the light-emitting units includes a plurality of pixels, the pixels are disposed in the opening regions, and at least two of the pixels in each of the light-emitting units have different heights; and a cover plate disposed opposite to the driving substrate, wherein a transparent spacer layer is disposed between the body portion and the cover plate, and the transparent spacer layer is configured to maintain a distance between the driving substrate and the cover plate to be consistent. A gap between the driving substrate and the cover plate is maintained due to the addition of the transparent spacer layer, so that the thickness of the display panel is more uniform, and the display performance is improved.

Embodiments of the present invention have been described, but not intended to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A display panel, comprising:
   a driving substrate;
   a body portion comprising:
   a pixel definition layer disposed on the driving substrate, the pixel definition layer comprising a plurality of opening regions; and
   a plurality of light-emitting units, wherein each of the light-emitting units comprises a plurality of pixels, the pixels are disposed in the opening regions, and at least two of the pixels in each of the light-emitting units have different heights; and
   a cover plate disposed opposite to the driving substrate;
   wherein a transparent spacer layer is disposed between the body portion and the cover plate, and the transparent spacer layer is configured to maintain a distance between the driving substrate and the cover plate to be consistent;
   wherein the transparent spacer layer comprises a plurality of spacers disposed corresponding to positions of the light-emitting units;
   wherein the pixels comprise at least one main pixel and at least one sub-pixel, a height of the at least one main pixel is less than a height of the at least one sub-pixel, the spacers comprise a plurality of main spacers and a plurality of sub-spacers, each of the main spacers corresponds to a position of the at least one main pixel, each of the sub-spacers corresponds to a position of the at least one sub-pixel, and a height of the main spacers is greater than a height of the sub-spacers.

2. The display panel according to claim 1, wherein the body portion further comprises an insulating layer filled in the opening regions, and the insulating layer surrounds a periphery of each of the pixels.

3. The display panel according to claim 1, wherein the transparent spacer layer covers the body portion.

4. The display panel according to claim 1, wherein a first difference is defined between the height of the at least one main pixel and the height of the at least one sub-pixel, a second difference is defined between the height of the main spacers and the height of the sub-spacers, and the second difference is equal to the first difference.

5. The display panel according to claim 4, wherein each cross-sectional structure of the at least one main pixel and a cross-sectional structure of the at least one sub-pixel comprises a first electrode, and a light-emitting diode and a second electrode sequentially disposed on the first electrode, and wherein the cross-sectional structure of the at least one sub-pixel further comprises a color conversion layer, and the color conversion layer is disposed on the second electrode.

6. The display panel according to claim 1, wherein the transparent spacer layer is disposed on a side of the cover plate close to the body portion.

7. The display panel according to claim 1, wherein the transparent spacer layer is disposed on the body portion.

8. The display panel according to claim 1, wherein the transparent spacer layer is made of an elastic material.

9. An electronic device comprising a display panel, comprising:
   a driving substrate;
   a body portion comprising:
   a pixel definition layer disposed on the driving substrate, the pixel definition layer comprising a plurality of opening regions; and
   a plurality of light-emitting units, wherein each of the light-emitting units comprises a plurality of pixels, the pixels are disposed in the opening regions, and at least two of the pixels in each of the light-emitting units have different heights; and
   a cover plate disposed opposite to the driving substrate;
   wherein a transparent spacer layer is disposed between the body portion and the cover plate, and the transparent spacer layer is configured to maintain a distance between the driving substrate and the cover plate to be consistent;
   wherein the transparent spacer layer comprises a plurality of spacers disposed corresponding to positions of the light-emitting units;
   wherein the pixels comprise at least one main pixel and at least one sub-pixel, a height of the at least one main pixel is less than a height of the at least one sub-pixel, the spacers comprise a plurality of main spacers and a plurality of sub-spacers, each of the main spacers corresponds to a position of the at least one main pixel, each of the sub-spacers corresponds to a position of the at least one sub-pixel, and a height of the main spacers is greater than a height of the sub-spacers.

10. The electronic device according to claim 9, wherein the body portion further comprises an insulating layer filled in the opening regions, and the insulating layer surrounds a periphery of each of the pixels.

11. The electronic device according to claim 9, wherein the transparent spacer layer covers the body portion.

12. The electronic device according to claim 9, wherein a first difference is defined between the height of the at least one main pixel and the height of the at least one sub-pixel, a second difference is defined between the height of the main spacers and the height of the sub-spacers, and the second difference is equal to the first difference.

13. The electronic device according to claim 9, wherein the transparent spacer layer is disposed on a side of the cover plate close to the body portion.

14. The electronic device according to claim 9, wherein the transparent spacer layer is made of an elastic material.

15. A method of manufacturing a display panel, comprising:
   fabricating a pixel definition layer on a driving substrate and patterning the pixel definition layer to form a plurality of opening regions;
   sequentially fabricating a first electrode and a light-emitting diode in the opening regions;
   fabricating a second electrode on the light-emitting diode;
   fabricating a color conversion layer on a part of the second electrode to obtain a base; and
   fabricating a transparent spacer layer between the base and a cover plate;
   wherein after the step of sequentially fabricating the first electrode and the light-emitting diode in the opening regions and before the step of fabricating the second electrode on the light-emitting diode, the method further comprises:
   forming an insulating layer in the opening regions of a periphery of the first electrode and the light-emitting diode.

* * * * *